(12) United States Patent
Roy et al.

(10) Patent No.: US 10,488,499 B2
(45) Date of Patent: Nov. 26, 2019

(54) TIME-OF-FLIGHT DETECTION PIXEL

(71) Applicants: STMicroelectronics (Crolles 2) SAS, Crolles (FR); Commissariat A L'Energie Atomique et aux Energies Alternatives, Paris (FR)

(72) Inventors: Francois Roy, Seyssins (FR); Marie Guillon, Paris (FR); Yvon Cazaux, Grenoble (FR); Boris Rodrigues, Grenoble (FR); Alexis Rochas, Paris (FR)

(73) Assignees: STMicroelectronics (Crolles 2) SAS, Crolles (FR); Commissariat A L'Energie Atomique et aux Energies Alternatives, Paris (FR)

( * ) Notice: Subject to any disclaimer, the term of this patent is extended or adjusted under 35 U.S.C. 154(b) by 396 days.

(21) Appl. No.: 15/387,883

(22) Filed: Dec. 22, 2016

(65) Prior Publication Data

US 2017/0192090 A1    Jul. 6, 2017

(30) Foreign Application Priority Data

Dec. 30, 2015 (FR) ..................... 15 63457

(51) Int. Cl.
*G01S 7/486* (2006.01)
*H01L 27/146* (2006.01)
(Continued)

(52) U.S. Cl.
CPC .......... *G01S 7/4863* (2013.01); *G01S 7/4914* (2013.01); *H01L 27/1461* (2013.01);
(Continued)

(58) Field of Classification Search
CPC ................ G01S 7/4914; G01S 7/4863; H01L 27/14645; H01L 27/1461; H01L 27/14641;
(Continued)

(56) References Cited

U.S. PATENT DOCUMENTS 7,436,496 B2    10/2008  Kawahito
7,595,827 B2     9/2009  Sato
(Continued)

FOREIGN PATENT DOCUMENTS

EP          2881991 A1    6/2015

OTHER PUBLICATIONS

INPI Search Report and Written Opinion for FR 1563457 dated Sep. 8, 2016 (7 pages).

*Primary Examiner* — Daniel L Murphy
(74) *Attorney, Agent, or Firm* — Crowe & Dunlevy

(57) ABSTRACT

A time-of-flight detection pixel includes a photosensitive area including a first doped layer and a charge collection area extending in the first doped layer. At least two charge storage areas extend from the charge collection area, each including a first well more heavily doped than the charge collection area and separated from the charge collection area by a first portion of the first doped layer which is coated with a gate. Each charge storage area is laterally delimited by two insulated conductive electrodes, extending parallel to each other and facing each other. A second heavily doped layer of opposite conductivity coats the pixel except for at each portion of the first doped layer coated with the gate.

22 Claims, 7 Drawing Sheets

(51) Int. Cl.
*H04N 5/374* (2011.01)
*G01S 7/491* (2006.01)

(52) U.S. Cl.
CPC .. *H01L 27/14607* (2013.01); *H01L 27/14612* (2013.01); *H01L 27/14641* (2013.01); *H01L 27/14645* (2013.01); *H01L 27/14683* (2013.01); *H04N 5/374* (2013.01); *H01L 27/1463* (2013.01); *H01L 27/14625* (2013.01); *H01L 27/14643* (2013.01)

(58) Field of Classification Search
CPC ......... H01L 27/14683; H01L 27/14607; H01L 27/14612; H01L 27/14625; H01L 27/1463; H01L 27/14643; H04N 5/374
USPC ....................................................... 356/5.01
See application file for complete search history.

(56) References Cited

U.S. PATENT DOCUMENTS

| | | | |
|---|---|---|---|
| 8,184,191 | B2 | 5/2012 | Sugawa et al. |
| 9,117,712 | B1 | 8/2015 | Oggier et al. |
| 10,162,048 | B2 * | 12/2018 | Roy ..................... G01S 7/4914 |
| 2007/0158770 | A1 | 7/2007 | Kawahito |
| 2008/0106625 | A1 | 5/2008 | Border et al. |
| 2010/0006969 | A1 | 1/2010 | Park et al. |
| 2011/0019049 | A1 | 1/2011 | Jin et al. |
| 2011/0180860 | A1 | 7/2011 | Yamada et al. |
| 2013/0181119 | A1 | 7/2013 | Bikumandla et al. |
| 2013/0228691 | A1 | 9/2013 | Shah |
| 2014/0347442 | A1 | 11/2014 | Wang et al. |
| 2016/0043120 | A1 | 2/2016 | Ann et al. |
| 2016/0133659 | A1 | 5/2016 | Chao et al. |
| 2017/0293031 | A1 | 10/2017 | Popp |

* cited by examiner

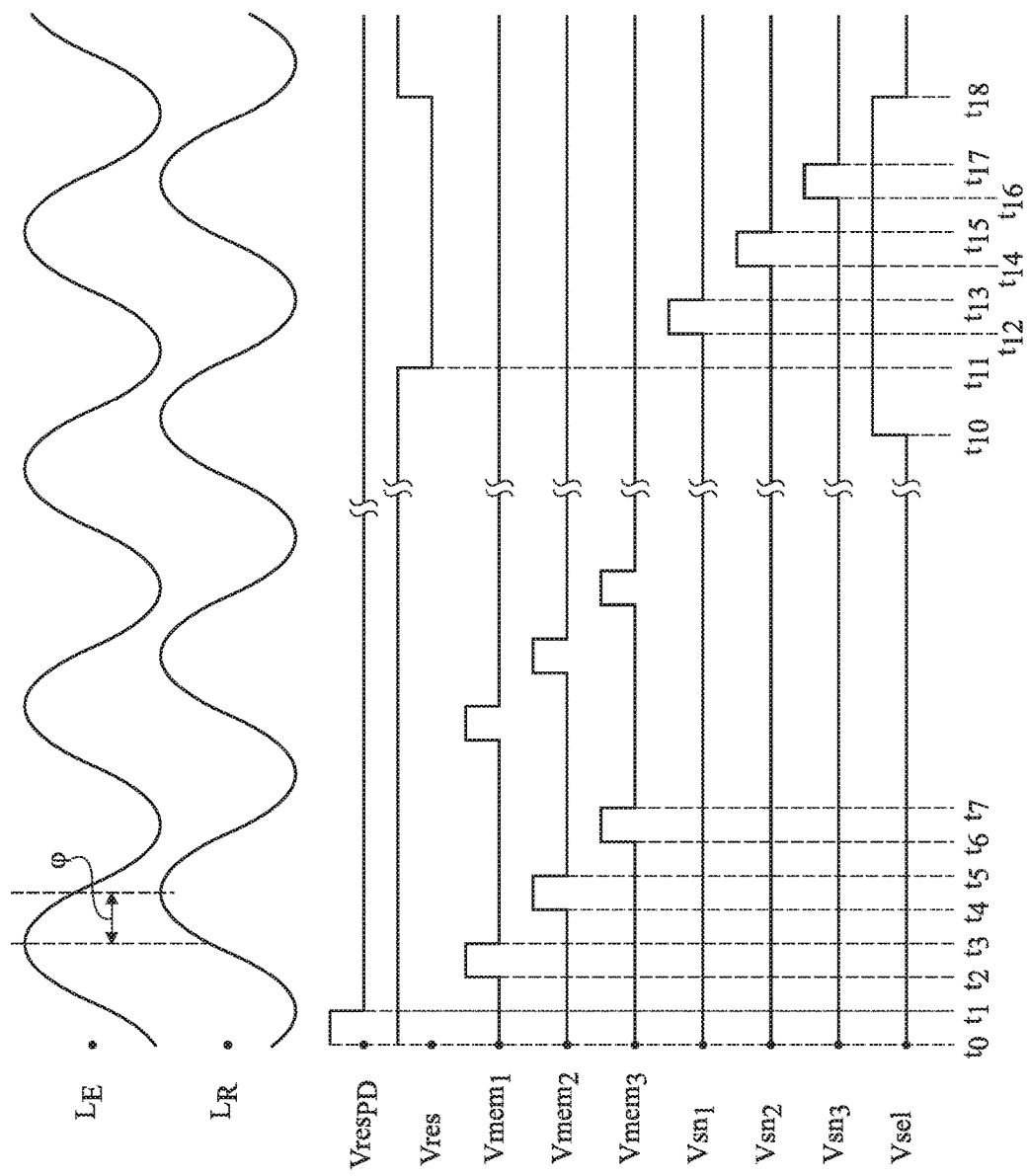

TIME-OF-FLIGHT DETECTION PIXEL

PRIORITY CLAIM

This application claims the priority benefit of French Application for Patent No. 1563457, filed on Dec. 30, 2015, the disclosure of which is hereby incorporated by reference in its entirety to the maximum extent allowable by law.

TECHNICAL FIELD

The present disclosure relates to a distance sensor operating based on time-of-flight (TOF) measurement, or TOF sensor.

BACKGROUND

In a TOF sensor, a light source emits light towards a scene. A time-of-flight detection pixel, or TOF pixel, of the sensor receives the light reflected by a point of the scene conjugate with this pixel. The measurement of the time of flight, that is, of the time taken by the light to travel from the light source to the point of the scene of which the pixel is conjugate, and from this point to the pixel, enables to calculate the distance separating the pixel from this point.

In the case where a three-dimensional image of a scene is desired to be obtained, the TOF sensor comprises an array of TOF pixels to measure the distance separating each pixel from the point of the scene conjugate with this pixel. This provides a mapping of the distances separating the sensor from the different points of the scene conjugate with the pixels, and a three-dimensional image of the scene can then be reconstructed from this distance mapping. However, current TOF pixels have relatively large dimensions. For example, a TOF pixel comprising a SPAD-type photodiode ("Single Photon Avalanche Diode") may have a surface area in the order of 30 µm by 30 µm.

It would thus be desirable to have a TOF pixel overcoming at least some of the disadvantages of existing TOF pixels, particularly a TOF pixel having a surface area smaller than 10 µm by 10 µm, preferably smaller than 5 µm by 5 µm.

SUMMARY

An embodiment provides a time-of-flight detection pixel comprising a photosensitive area comprising a first doped layer of a first conductivity type; a charge collection area extending in the first layer and being more heavily doped of the first type than the first layer; at least two charge storage areas extending from the collection area and each comprising a first well more heavily doped of the first type than the collection area and separated from said collection area by a first portion of the first layer coated with a first gate, each charge storage area being laterally delimited by two insulated conductive electrodes, parallel and facing each other.

The pixel may further comprise a second heavily doped layer of the second conductivity type coating the photosensitive area, the charge collection area and the first well.

According to an embodiment, the first layer is supported by a doped semiconductor substrate of the second conductivity type.

According to an embodiment, the collection area extends in doped fingers of the first type, coated with the second layer, and extending in the photosensitive area, the fingers being more heavily doped than the first layer and more lightly doped than or of same doping level as the collection area.

According to an embodiment, the collection area is arranged in a central portion of the photosensitive area.

According to an embodiment, the pixel further comprises, under each first gate, a doped intermediate area of the first type interposed between the first corresponding portion and the first corresponding well, the intermediate area being more heavily doped than the first corresponding portion and more lightly doped than the first corresponding well.

According to an embodiment, the pixel further comprises a region more heavily doped of the second type than the collection area, capable of being coupled to a reference potential, and separated from the collection area by a second portion of the first layer coated with a second gate.

According to an embodiment, the pixel further comprises, for each storage area, a sense area more heavily doped of the first type than the first well, the storage area extending all the way to the sense area and being separated from the sense area by a third portion of the first layer coated with a third gate.

According to an embodiment, the pixel further comprises, for each storage area, at least one memory area extending from the storage area and comprising a second well more heavily doped of the first type than the first well, coated with the second layer, and separated from the first well by a third portion of the first layer coated with a third gate, the memory area being laterally delimited by two parallel insulated conductive electrodes, facing each other.

According to an embodiment, the pixel comprises two storage areas, each of which is associated with two memory areas.

According to an embodiment, the pixel further comprises, for each memory area, a sense area more heavily doped of the first type than the second well, the memory area extending all the way to the sense area and being separated from the sense area by a fourth portion of the first layer coated with a fourth gate.

According to an embodiment, each sense area is electrically connected to a same terminal of a read circuit.

An embodiment provides an image sensor comprising an array of pixels such as hereabove associated with a source for emitting modulated light, and means capable of synchronizing said source and control potentials applied to the gates of transistors of the pixel.

According to an embodiment, each first gate is capable of receiving or not a first potential to allow or forbid a charge transfer from the collection area to the corresponding storage area.

According to an embodiment, each third gate is capable of receiving or not a second potential to allow or forbid a charge transfer from the corresponding storage area to the corresponding sense area.

According to an embodiment, each third gate is capable of receiving or not a second potential to allow or forbid a charge transfer from the corresponding storage area to the corresponding memory area, and, further, each fourth gate is capable of receiving or not a third potential to allow or forbid a charge transfer from the corresponding memory area to the corresponding sense area.

BRIEF DESCRIPTION OF THE DRAWINGS

The foregoing and other features and advantages will be discussed in detail in the following non-limiting description of specific embodiments in connection with the accompanying drawings, wherein:

FIG. 3 is a timing diagram illustrating a control mode of the TOF pixel of FIG. 2;

DETAILED DESCRIPTION

Figure 1:
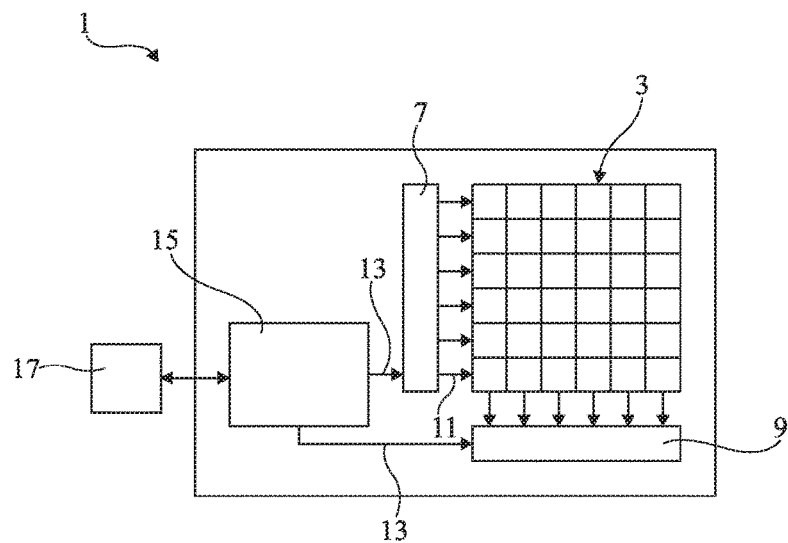
FIG. 1 is a top view schematically showing an example of a TOF sensor.

The same elements have been designated with the same reference numerals in the various drawings and, further, the various drawings are not to scale. For clarity, only those elements which are useful to the understanding of the described embodiments have been shown and are detailed.

In the following description, terms "high", "low", "left", "right", "under", "over", "vertical", and "upper" refer to the concerned elements in the corresponding drawings. Unless otherwise specified, expressions "substantially", "approximately", and "in the order of" mean to within 10%, preferably to within 5%.

FIG. 1 is a simplified top view of an example of a TOF sensor. Sensor 1 comprises an array 3 of TOF pixels, for example, an array of 1,000 rows by 1,000 columns. Array 3 is associated with a row decoder 7 and with a column decoder 9. Row decoder 7 delivers signals 11 enabling to select one or the other of the array rows. Column decoder 9 enables to read the information from the pixels of a selected row. Row decoder 7 and column decoder 9 are controlled by signals 13 delivered by a control and processing circuit 15. Control and processing circuit 15, for example, comprises a processor associated with one or a plurality of memories. Sensor 1 is associated with a light source 17 to illuminate a scene for which a three-dimensional image is desired to be obtained. Light source 17 is for example a laser having a wavelength which may be in the range from 500 to 1,000 nm. Light source 17 is connected to control and processing circuit 15 to synchronize the control signals applied to the TOF pixels of array 3 and light source 17.

In the following description, the case of a sensor 1 where light source 17 emits a sinusoidal signal $L_E$ having a frequency which may be in the range from 20 to 100 MHz, for example, 25 MHz, is considered. For each pixel, phase-shift $\varphi$ between the emitted light signal $L_E$ and the light signal $L_R$ received by this pixel is determined. The distance separating the pixel from its conjugate point is then determined from phase shift $\varphi$.

Figure 2:
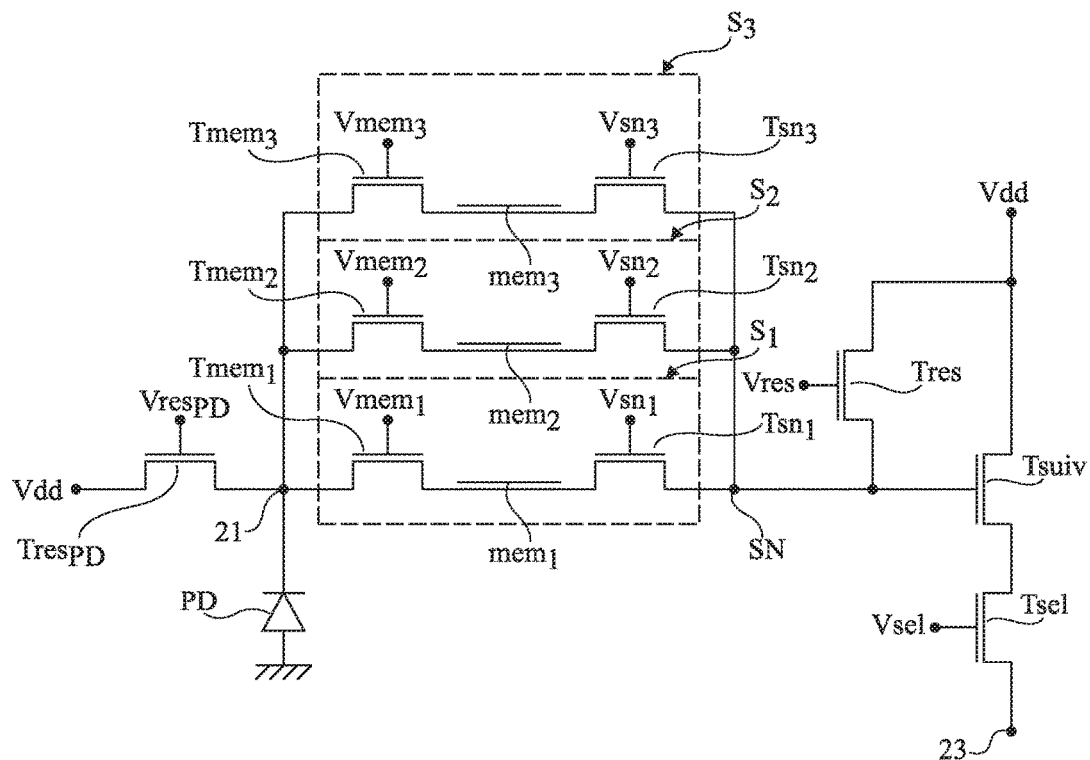
FIG. 2 shows an example of a TOF pixel circuit.

FIG. 2 shows an example of a TOF pixel circuit.

The TOF pixel comprises a photosensitive element (photodiode PD) having a terminal connected to a node 21 and having its other terminal connected to a low reference potential, for example, the ground. Node 21 is coupled to sense node SN via three identical assemblies S1, S2, and S3 connected in parallel between nodes 21 and SN. Each assembly $S_i$, with i equal to 1, 2, or 3 in this example, comprises a transfer N-channel MOS transistor, $Tmem_i$, a charge storage area $mem_i$, and a sense N-channel MOS transistor, $Tsn_i$. The source of transistor $Tmem_i$ is connected to node 21, and the drain of transistor $Tmem_i$ is connected to a terminal of storage area $mem_i$. Transistor $Tmem_i$ is controlled by a signal $Vmem_i$ applied to its gate. The source of transistor $Tsn_i$ is connected to the other terminal of storage area $mem_i$, and the drain of transistor $Tsn_i$ is connected to sense node SN. Transistor $Tsn_i$ is controlled by a signal $Vsn_i$ applied to its gate. Examples of storage areas $mem_i$ will be given hereafter.

The TOF pixel is associated with a sense device which may be common to a plurality of pixels, for example, four pixels. The sense device comprises a precharge N-channel MOS transistor, Tres, an N-channel MOS transistor assembled as a follower source, Tsuiv, and a selection N-channel MOS transistor, Tsel, connected as shown. Sense node SN is coupled to a high reference potential, for example, power supply potential Vdd, by transistor Tres, the latter being controlled by a signal Vres applied to its gate. Sense node SN is also coupled to the gate of transistor Tsuiv having its drain coupled to the high reference potential, and having its source coupled to an output line 23 of the pixel circuit via transistor Tsel, transistor Tsel being controlled by a signal Vsel applied to its gate.

In this example, the TOF pixel further comprises an N-channel MOS transistor, $Tres_{PD}$, for resetting photosensitive element PD. The source of transistor $Tres_{PD}$ is connected to node 21 and the drain of transistor $Tres_{PD}$ is connected to high potential Vdd. Transistor $Tres_{PD}$ is controlled by a signal $Vres_{PD}$ applied to its gate.

To determine the phase shift $\varphi$ between the emitted light signal $L_E$ and the light signal $L_R$ received by the pixel, signal $L_R$ is sampled by transferring, successively and at regular intervals, charges photogenerated in the photosensitive element towards storage areas $mem_1$, and then $mem_2$, and finally $mem_3$. The total duration to carry out these three successive transfers is equal to a period of signals $L_E$ and $L_R$. Further, these three successive transfers are repeated a large number of times, for example, at least 100,000 times. The charges stored in the storage areas are then read by transferring, to node SN, the charges from area $mem_1$, and then from area $mem_2$, and finally from area $mem_3$.

An embodiment of the TOF pixel of FIG. 2 will now be described in further detail in relation with FIG. 3.

FIG. 3 is a timing diagram of light signal $L_E$ emitted by light source 17 associated with sensor 1, of light signal $L_R$ received by the TOF pixel, and of digital signals $Vres_{PD}$, Vres, $Vmem_i$, $Vsn_i$, and Vsel. By default, signals $Vres_{PD}$, $Vmem_i$, $Vsn_i$, and Vsel are at a low level and signal Vres is at a high level.

A resetting of photosensitive element PD is first performed by setting transistor $Tres_{PD}$ to the on state (signal $Vres_{PD}$ in the high state) between times $t_0$ and $t_1$. An integration cycle of the pixel then starts and is synchronized on signal $L_E$.

During the integration cycle, the charges photogenerated in photosensitive area PD are transferred to storage areas $mem_i$. To achieve this, transfer transistors $Tmem_i$ are each set to the on state in turn. More particularly, transistor $Tmem_1$ is set to the on state ($Vmem_1$ high) between times $t_2$ and $t_3$, transistor $Tmem_2$ is set to the on state ($Vmem_2$ high) between times $t_4$ and $t_5$, and transistor $Tmem_3$ is set to the on state ($Vmem_3$ high) between times $t_6$ and $t_7$. As previously indicated, these three transfers are then repeated a large number of times. All along the integration cycle, signal Vres is in the high state, transistor Tres is on, and the voltage of sense node SN is substantially equal to the high reference potential.

At the end of the integration cycle, from a time t10, the charges stored in each of storage areas $mem_i$ are read. To achieve this, sense transistors $Tsn_i$ are each in turn set to the on state, and the voltage level on node SN is measured and stored after each reading of the charges stored in a storage area $mem_i$. More particularly, transistor Tsel is set to the on state (Vsel high) at time $t_{10}$ and precharge transistor Tres is set to the off state (Vres low) at a time $t_{11}$. Transistor Tsn1 is then set to the on state (Vsn1 high) between successive times $t_{12}$ and $t_{13}$, after which the sequence on Tres and Tsn is repeated by the application of a new precharge pulse on transistor Tres before the reading of the second sample, followed by a switching to the on state of transistor $Tsn_2$ (Vsn$_2$ high) between successive times $t_{14}$ and $t_{15}$, and, finally, this sequence is repeated a third time before the application of a pulse on Tres and the reading of the third sample when transistor $Tsn_3$ is set to the on state (Vsn$_3$ high) between successive times $t_{16}$ and $t_{17}$. First, second, and third voltage levels of node SN are measured and stored, respectively between times $t_{13}$ and $t_{14}$, between times $t_{15}$ and $t_{16}$, and between times $t_{17}$ and a time $t_{18}$. At time $t_{18}$, signal Vsel is set to the low state and signal Vres is set back to the high state. A new integration cycle may then start.

In this embodiment, the first, second, and third measured voltage levels are representative of the charges stored, respectively, in storage area $mem_1$, in storage area $mem_2$, and in storage area $mem_3$. In a preferred alternative embodiment, a resetting of sense node SN is provided after each reading of the charges stored in a storage area $mem_i$. In this case, the first, second, and third voltage levels are representative of the charges stored in a single storage area, respectively $mem_1$, $mem_2$, and $mem_3$.

These three voltage levels enable to determine phase shift φ between light signals $L_E$ and $L_R$, and thus to deduce therefrom the distance separating the pixel from the point in the scene conjugate with the pixel.

Although an embodiment and a control mode of a TOF pixel circuit comprising three identical assemblies $S_i$, phase shift φ between signals $L_E$ and $L_R$ may also be determined by using a TOF pixel comprising more than three assemblies $S_i$, for example, four assemblies $S_i$.

As an example, the duration of a transfer towards a storage area $mem_i$ is in the range from 5 to 30 ns. The duration separating two transfers to a same storage area $mem_i$ is for example 40 ns when the frequency of these signals is 25 MHz. In this case, the duration of an integration cycle may be approximately 10 ms when the charge transfers to each of storage areas $mem_i$ are performed 250,000 times each. The duration of a charge transfer from a storage area $mem_i$ to sense node SN is for example in the range from 1 to 10 μs.

In a pixel, within a few nanoseconds, few charges are photogenerated in photosensitive element PD, for example, from 0 to 10 charges. Such charges should be integrally transferred to a storage area $mem_i$. In particular, no charge should remain blocked in photosensitive element PD or in the channel of the corresponding transistor $Tmem_i$.

An embodiment of a TOF pixel allowing a complete transfer of the charges photogenerated in photosensitive area PD towards storage areas $mem_i$ will now be described in relation with FIGS. 4A to 4C.

Figure 4A:
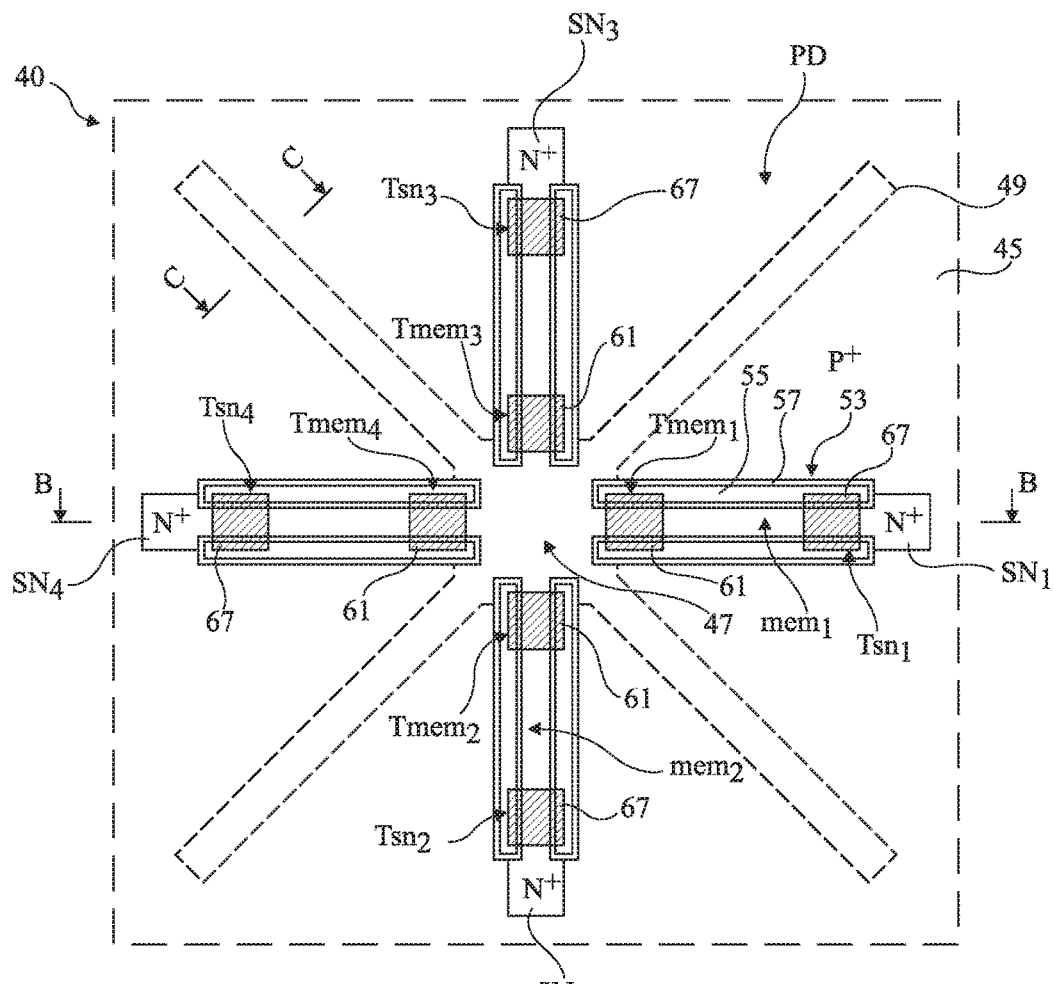
FIGS. 4A to 4C schematically show an embodiment of a TOF pixel of the type in FIG. 2.
Figure 4B:
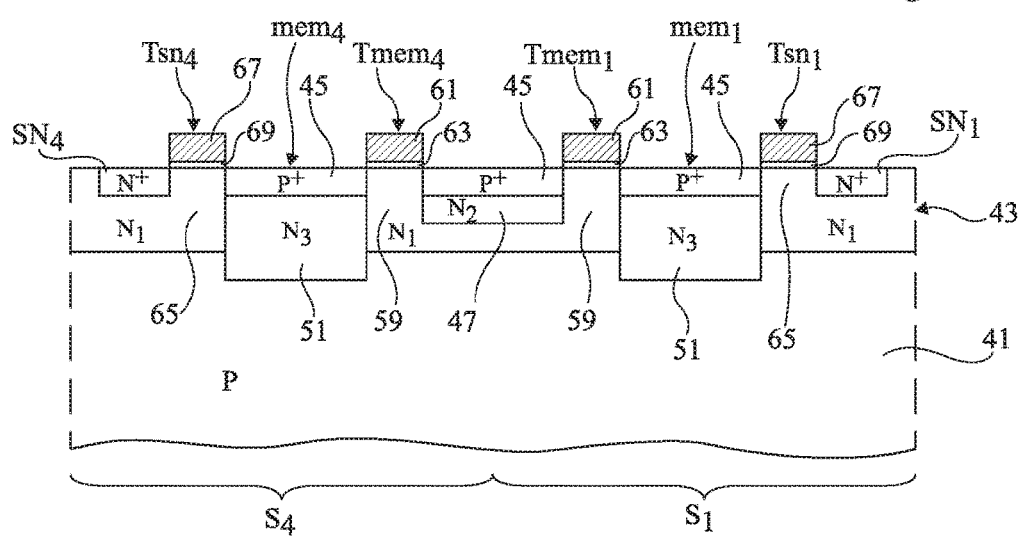
Figure 4C:
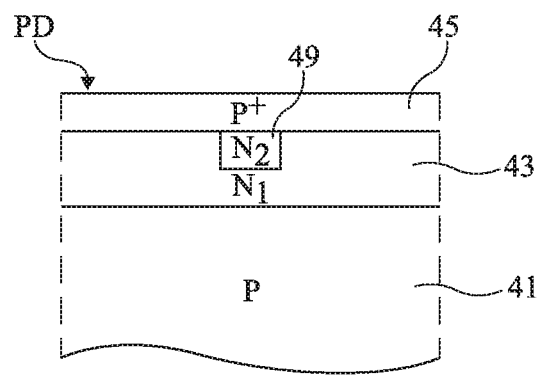

FIGS. 4A to 4C schematically show an embodiment of a TOF pixel, FIG. 4A being a top view of this pixel and FIGS. 4B and 4C being cross-section views respectively along planes BB and CC of FIG. 4A. In this embodiment, a TOF pixel 40 comprises four assemblies $S_i$, with i equal to 1, 2, 3, or 4. Each assembly $S_i$ comprises a transfer transistor $Tmem_i$, a storage area $mem_i$, and a sense transistor $Tsn_i$.

TOF pixel 40 comprises a photosensitive area PD comprising, on a P-type doped semiconductor substrate 41, an N-type doped layer 43, of doping level $N_1$. Layer 43 is coated with a heavily-doped P-type layer 45 (P$^+$).

TOF pixel 40 also comprises, in layer 43, an N-type doped charge collection area 47, of doping level $N_2$ higher than $N_1$, collection area 47 being coated with layer 45. Charge collection area 47 extends in fingers 49 coated with layer 45 and extending in layer 43. Fingers 49 are N-type doped, of same doping level $N_2$ as collection area 47.

Each of storage areas $mem_i$ of the pixel comprises an N-type doped well 51, having a doping level $N_3$ higher than $N_2$. Each well 51 is coated with P$^+$ layer 45, extends through all or part of the thickness of layer 43, and may penetrate into substrate 41. Each storage area $mem_i$ is laterally delimited by two insulated vertical electrodes 53 which extend from the upper surface of the pixel and penetrate into substrate 41 down to a depth at least equal to that of well 51. Electrodes 53 comprise a conductive material 55, for example, doped polysilicon, bordered with a layer of an insulating material 57, for example, silicon oxide. Each storage area $mem_i$ extends between charge collection area 47 and a heavily-doped N-type sense area $SN_i$ (N$^+$). Sense areas $SN_i$ are preferably electrically connected to one another and correspond to sense node SN described in relation with FIG. 2. Each storage area $mem_i$ is separated from collection area 47 by a portion 59 of layer 43 at the level of which layer 43, instead of being coated with P$^+$ layer 45, is coated with gate 61 of the corresponding transfer transistor $Tmem_i$, gate 61 being insulated from layer 43 by a gate insulator layer 63. Each storage area $mem_i$ is separated from the corresponding sense area $SN_i$ by a portion 65 of layer 43 at the level of which layer 43, instead of being coated with P$^+$ layer 45, is coated with gate 67 of sense transistor $Tsn_i$, gate 67 being insulated from layer 43 by a gate insulator layer 69.

In this embodiment, four storage areas $mem_i$ and four fingers 49 are regularly arranged around charge collection area 47, the latter being arranged in a substantially central portion of photosensitive area PD. As can be seen in FIG. 4A, storage areas $mem_i$ may be elongated, for example, of rectangular shape, each area $mem_i$ then extending widthwise between two parallel vertical insulated electrodes 53 facing each other. Although this has not been shown herein, each of assemblies $S_i$ is coated with a screen opaque to light so that no charge can be photogenerated in storage areas $mem_i$. Further, photosensitive area PD is delimited by insulating structures, not shown, for example, by insulated vertical electrodes similar to electrodes 53.

In operation, substrate 41 is connected to a low reference potential, for example, the ground. Insulated electrodes 53 are connected to a potential smaller than or equal to 0 V, for example, −2 V, whereby holes accumulate along their walls. Such a hole accumulation enables to decrease dark currents and, further, to electrically connect substrate 41 to P$^+$ layer 45 which then is at the low reference potential. Photosensitive area PD and storage areas $mem_i$ thus correspond to so-called "pinned" diodes. Further, doping levels $N_1$, $N_2$, and $N_3$ are selected so that, in the absence of illumination, the diodes corresponding to photosensitive area PD and to storage areas $mem_i$ are fully depleted, and that the maximum electrostatic potential trough in wells 51 is higher than that in collection area 47 and fingers 49, which is itself higher than that in layer 43 of photosensitive area PD.

When the pixel receives light from a scene, electron-hole pairs are photogenerated in photosensitive area PD. The holes are drained off towards substrate 41 and the electrons are attracted into layer 43 of photosensitive area PD. Due to the fact that the electrostatic potential is higher in collection area 47 and in fingers 49 than in layer 43, electrons are attracted into fingers 49 and are drained towards charge collection area 47.

The electron transfer from charge collection area 47 to a storage area $mem_i$ is performed bulkwise rather than at the surface. In other words, the transferred electrons flow from $N_2$ well 47 to $N_3$ well 51 without reaching the interface between gate insulator layer 63 and layer 43, which advantageously enables to prevent such electrons from recombining with defects of this interface. Thus, the electrons stored in storage area 47 are effectively all transferred to storage area $mem_i$.

Advantageously, the surface area of pixel 40 may be small, for example, in the order of 3 μm by 3 μm. This particularly results from the fact that storage areas $mem_i$ may have small dimensions, for example, a width of approximately 0.2 μm and a length of approximately 1 μm.

Although fingers 49 of same doping level as the charge collection area have been described, in alternative embodiments, the doping level of fingers 49 may be between doping levels $N_1$ and $N_2$. For each finger 49, this doping level may be constant or may increase closer to charge collection area 47. In this last case, the electrons will be more efficiently drained towards the charge collection area.

As an example, substrate 41 is made of silicon. Layer 43 may be formed by epitaxy on substrate 41 and be N-type doped in situ to a doping level $N_1$. The thickness of layer 43 is for example in the order of 500 nm. Doping level $N_1$ is for example in the range from $5 \times 10^{15}$ to $10^{17}$ at/cm$^3$, for example, $5 \times 10^{16}$ at/cm$^3$. Charge collection area 47 and fingers 49 may be formed by implantation of dopant atoms in layer 43. The thickness of layer 47 and of fingers 49 may be in the order of 300 nm. The collection area may have a surface area in the order of 500 nm*500 nm and fingers 49 may have a length in the order of 200 nm. Doping level $N_2$ is for example in the range from $5 \times 10^{16}$ to $5 \times 10^{17}$ at/cm$^3$, for example, $2 \times 10^{17}$ at/cm$^3$. Well 51 may be formed by implantation of dopant atoms in layer 43, and the dopant atoms may penetrate all the way into substrate 41. The thickness of well 51 is for example in the order of 0.5 μm. Doping level $N_3$ is for example in the range from 1 to $8 \times 10^{17}$ at/cm$^3$, for example, $4 \times 10^{17}$ at/cm$^3$. The length of gates 61 and/or 67 may be approximately 300 nm. P$^+$ layer 45 is for example formed by implantation of dopant atoms and may have a thickness of approximately 100 nm. The doping level of layer 45 may be in the range from $2 \times 10^{17}$ to $10^{19}$ at/cm$^3$, for example, $5 \times 10^{18}$ at/cm$^3$. Sense areas $SN_i$ may be formed by implantation of dopant atoms in layer 43. Doping level N$^+$ of sense areas $SN_i$ 45 may be in the range from $2 \times 10^{20}$ to $10^{21}$ at/cm$^3$, for example, $6 \times 10^{21}$ at/cm$^3$. Signal $Tmem_i$ is for example in the range from −2 to 0 V in the low state, and from 0 to 3.6 V in the high state. Signal $Vsn_i$ is for example in the range from −2 to 0 V in the low state, and from 1 to 3.6 V in the high state.

Figure 5:
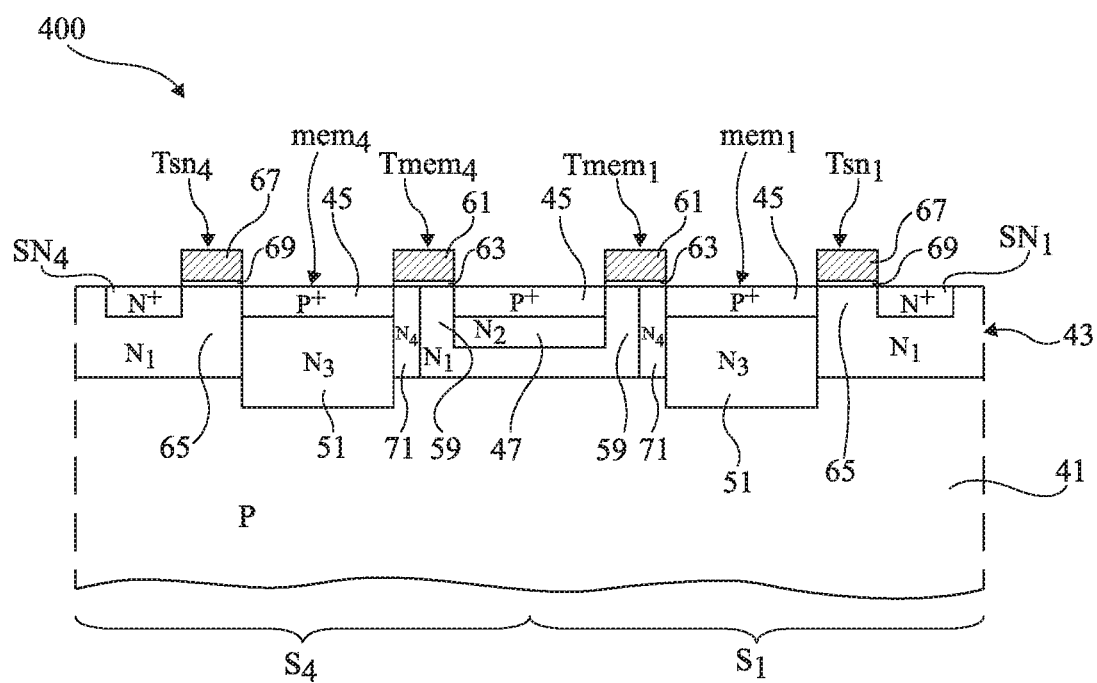
FIG. 5 is a simplified cross-section view of an alternative embodiment of the TOF pixel of FIGS. 4A to 4C.

FIG. 5, which corresponds to FIG. 4B, schematically shows an alternative embodiment of TOF pixel 40 of FIGS. 4A to 4C.

In this variation, a TOF pixel 400 thus comprises the same elements as TOF pixel 40 of FIGS. 4A to 4C, designated with the same reference numerals. Pixel 400 further comprises, under each gate 61, an intermediate N-type region 71, interposed between portion 59 and storage area $mem_i$. Intermediate region 71 has a doping level $N_4$ higher than $N_1$ and lower than $N_3$. As a result, the electrostatic potential in intermediate region 71 is higher than that in portion 59 and lower than that in well 51. This advantageously enables to avoid that, during an electron transfer from area 47 to an area $mem_i$, electrons remain trapped under the gate of transistor $Tmem_i$ and can return into collection area 47.

Figure 6A:
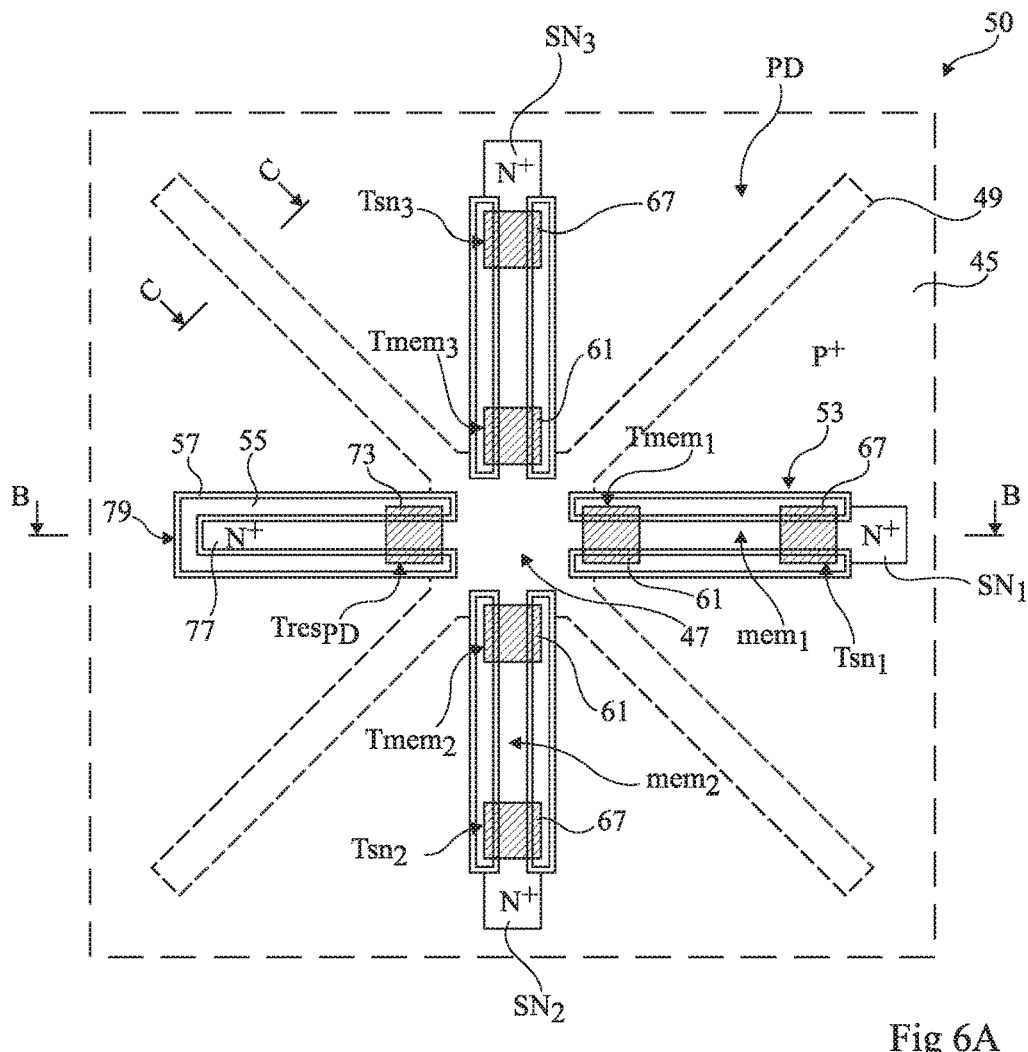
FIGS. 6A and 6B schematically show another alternative embodiment of the TOF pixel of FIGS. 4A to 4C.
Figure 6B:
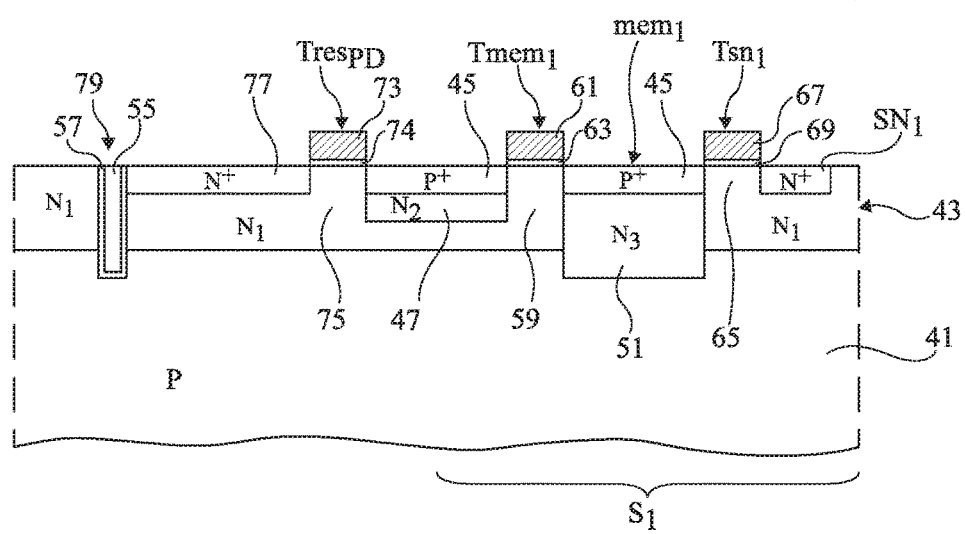

FIGS. 6A and 6B schematically show another alternative embodiment of a TOF pixel of the type in FIG. 2, FIG. 6A being a top view of the pixel and FIG. 6B being a cross-section view along plane BB of FIG. 6A. In this alternative embodiment, a TOF pixel 50 comprises three assemblies $S_i$, i being equal to 1, 2, or 3, and, further, a transistor $Tres_{PD}$.

TOF pixel 50 is similar to TOF pixel 40 of FIGS. 4A to 4C, with the difference that assembly $S_4$ of TOF pixel 40 is replaced with a transistor $Tres_{PD}$ for resetting photosensitive area PD. Transistor $Tres_{PD}$ comprises a gate 73 separated from layer 43 by a gate insulator layer 74. Gate 73 is arranged on a portion 75 of layer 43 extending between charge collection area 47 and a heavily-doped N-type region 77 (N$^+$) forming the drain of transistor $Tres_{PD}$ and being intended to be connected to a high potential. In this example, N$^+$ region 77 is laterally delimited, except on the side of the charge collection area, by an insulated vertical electrode 79 similar to insulated electrodes 53. It may be provided to replace electrode 79 with another insulating structure. Like each of assemblies $S_i$, transistor $Tres_{PD}$ may be coated with a shield opaque to light. As an example, signal $Vres_{PD}$ applied to gate 73 of transistor $Tres_{PD}$ is in the range from 2 to 3.5 V in the high state.

Although an embodiment of a transistor $Tres_{PD}$ has been described, this transistor may have other forms. Further, transistor $Tres_{PD}$ may be used as an anti-blooming device by adapting the potentials applied to N$^+$ area 77 and to the gate of transistor $Tres_{PD}$.

In the previously-described pixels, the storage areas extend between the charge collection area of the photosensitive area and corresponding sense areas. In such pixels, the charges photogenerated in the photosensitive area are regularly transferred from the charge collection area to the storage areas to be accumulated therein. In another embodiment, a pixel comprising, in addition to the storage areas, memory areas similar to the storage areas, is provided. Each memory area is interposed between a storage area and a sense area, a same storage area being capable of being associated with a plurality of memory areas. Each storage area then extends between the charge collection area and the memory area(s) to which it is associated. In such a pixel, the photogenerated charges are regularly transferred from collection area 47 to the storage areas, and from the storage areas to the memory areas. Thus, while charges are being transferred to a storage area, charges previously stored in another storage area are transferred to a memory area associated with this other storage area. The provision of memory areas interposed between the storage areas and the sense areas allows an intermediate storage in the storage areas before the transfer to one of the memory areas. This particularly has the following advantages:

passage area between collection area 47 and transistor $Tmem_i$ easier to define to avoid narrowings in this area, which might degrade the charge transfer, and possibility of reading from the collector with only two control signals, these two signals for example being sinusoids in phase opposition.

Figure 7A:
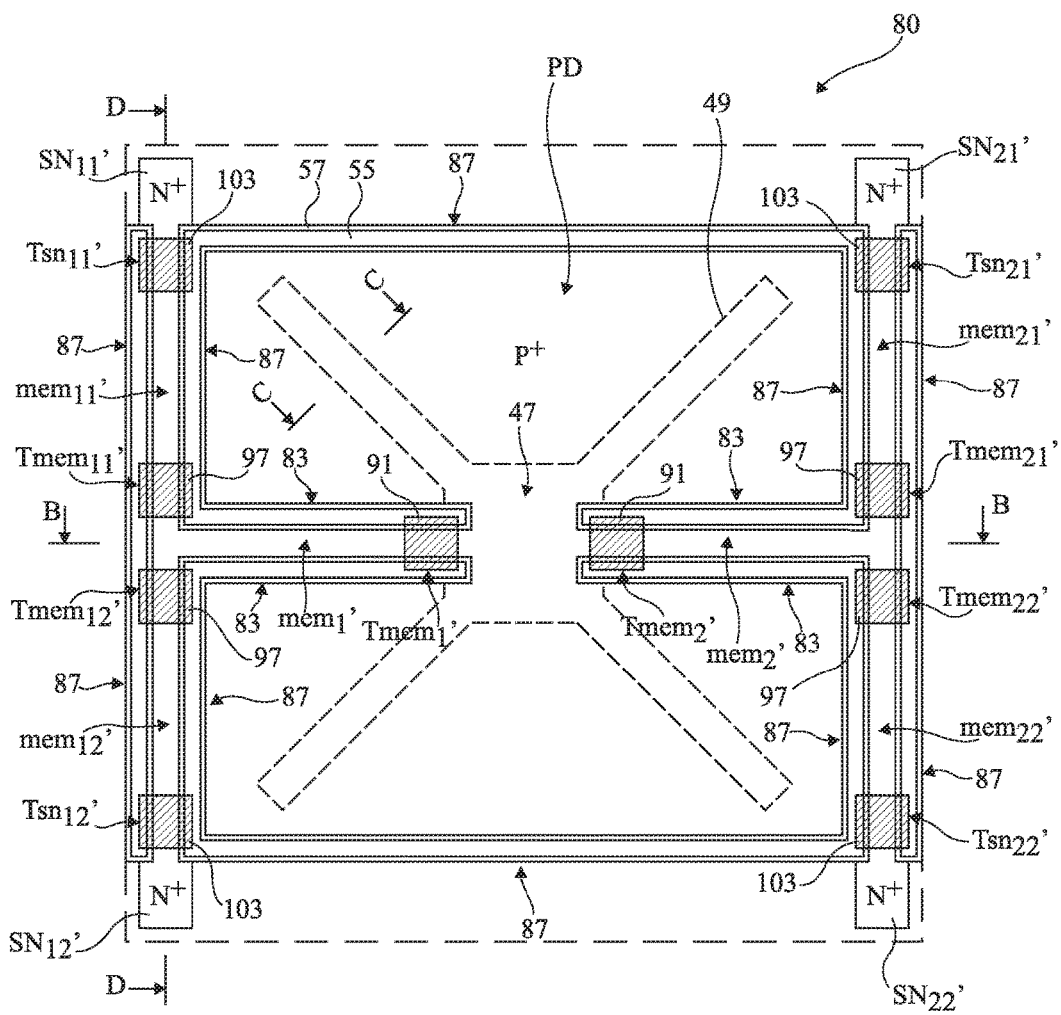
FIGS. 7A to 7D schematically shows another embodiment of a TOF pixel.

An embodiment of a TOF pixel 80 comprising memory areas interposed between the storage area and the sense areas will now be described in relation with FIGS. 7A to 7D. FIG. 7A is a top view of pixel 80, FIGS. 7B, 7C, and 7D being cross-section views respectively along planes BB, CC, and DD of FIG. 7A.

In this embodiment, TOF pixel 80 comprises two assemblies, each comprising a storage area $mem_i'$, with i equal to 1 or 2, associated with two memory areas $mem_{i1}'$ and $mem_{i2}'$, themselves associated with two sense areas $SN_{i1}'$ and $SN_{i2}'$ respectively. Each assembly comprises a first transfer transistor $Tmem_i'$ allowing or blocking a charge transfer from the charge collection area to storage area $mem_i'$, two second transfer transistors $Tmem_{i1}'$ and $Tmem_{i2}'$ allowing or blocking a charge transfer from storage area $mem_i'$ to memory areas $mem_{i1}'$ and $mem_{i2}'$, respectively, and two sense transistors $Tsn_{i1}'$ and $Tsn_{i2}'$ allowing or blocking a charge transfer from memory areas $mem_{i1}'$ and $mem_{i2}'$ to respective sense areas $SN_{i1}'$ and $SN_{i2}'$.

More particularly, TOF pixel 80 comprises photosensitive area PD comprising, on semiconductor substrate 41, layer 43 coated with P⁺ layer 45, and also comprises charge collection area 47 and fingers 49. Each of storage areas $mem_i'$ comprises an N-type doped well 81 at a doping level $N_5$ higher than $N_2$, well 81 being coated with P⁺ layer 45. Each well 81 extends through all or part of the thickness of layer 43 and may penetrate into substrate 41. Each of storage areas $mem_i'$ is laterally delimited by two insulated vertical electrodes 83 similar to previously-described electrodes 53. Each of memory areas $mem_{i1}'$ and $mem_{i2}'$ comprises an N-type doped well 85 at a doping level $N_6$ higher than $N_5$, well 85 being coated with P⁺ layer 45. Each well 85 extends through all or part of the thickness of layer 43 and may penetrate into substrate 41. Each of memory areas $mem_{i1}'$ and $mem_{i2}'$ is laterally delimited by two insulated vertical electrodes 87 similarly to insulated electrodes 53. In this example, each of storage areas $mem_i'$ and of memory areas $mem_{i1}'$ and $mem_{i2}'$ is elongated, of rectangular shape, and extends widthwise between two corresponding parallel insulated electrodes facing each other. As shown in FIG. 7A, one of the two electrodes 87 delimiting a memory area $mem_{i1}'$ or $mem_{i2}'$ may correspond to an extension of an electrode 83 delimiting storage area $mem_i'$. Further, since, in this example memory areas $mem_{i1}'$ and $mem_{i2}'$ border the sides of photosensitive area PD (to the left and to the right in FIG. 7A), electrodes 87 delimiting memory areas $mem_{i1}'$ and $mem_{i2}'$ on the side of the photosensitive area may extend beyond the memory areas to delimit sides of photosensitive area PD (at the top and at the bottom of FIG. 7A) which are not bordered with the memory areas. Storage areas $mem_i'$ and memory areas $mem_{i1}'$ and $mem_{i2}'$ are coated with a shield opaque to light, not shown. Each of sense areas $SN_{i1}'$ and $SN_{i2}'$ is heavily N-type doped (N⁺). Sense areas $SN_{i1}'$ and $SN_{i2}'$ are electrically connected to one another and form a sense node of pixel 80. As previously, a portion 89 of layer 43 separates each storage area $mem_i'$ of charge collection area 47. Portion 89, instead of being coated with P⁺ layer 45, is coated with gate 91 of transfer transistor $Tmem_i'$, insulated from layer 43 by a gate insulator layer 93. Each memory area $mem_{i1}'$ and $mem_{i2}'$ is separated from the corresponding storage area $mem_i'$ by a portion 95 of layer 43. Portion 95, instead of being coated with P⁺ layer 45, is coated with gate 97 of the corresponding transfer transistor $Tmem_{i1}'$ or $Tmem_{i2}'$, insulated from layer 43 by a gate insulator layer 99. Each sense area $SN_{i1}'$ and $SN_{i2}'$ is separated from the corresponding memory area $mem_{i1}'$ or $mem_{i2}'$ by a portion 101 of layer 43. Portion 101 of layer 43, instead of being coated with P⁺ layer 45, is coated with gate 103 of the corresponding sense transistor $Tsn_{i1}'$ or $Tsn_{i2}'$, insulated from layer 43 by a gate insulator layer 105. The structure of transistors $Tmem_i'$, $Tmem_{i1}'$, $Tmem_{i2}'$, $Tsn_{i1}'$, and $Tsn_{i2}'$ is similar to that of previously-described transistors $Tmem_i$, whereby the charge transfers authorized by the transistors are performed bulk-wise rather than surface-wise.

In operation, substrate 41 is connected to a low reference potential and insulated electrodes 83 and 87 are connected to a potential lower than or equal to 0 V. Doping levels $N_1$, $N_2$, $N_5$, and $N_6$ are selected so that, in the absence of illumination, photosensitive area PD and areas $mem_i'$, $mem_{i1}'$, and $mem_{i2}'$ correspond to fully-depleted pinned diodes, so that the maximum of the electrostatic well in wells 85 is higher than that in wells 81, and so that the maximum electrostatic potential trough in wells 81 is higher than in charge collection area 47 and in fingers 49.

As an example, the dimensions of the gates of the transistors of pixel 80 and of the storage and memory areas are substantially the same as those of the gates of the transistors and of the storage areas of previously-described pixels 40, 400, and 50. Further, wells 81 and 91 of pixel 80 may have thicknesses of the same order as those of wells 51 of pixels 40, 400, and 50. Doping level $N_5$ may be in the range from $1\times10^{17}$ at/cm³ to $4\times10^{17}$ at/cm³, for example, $2\times10^{17}$ at/cm³. Doping level $N_6$ may be in the range from $4\times10^{17}$ at/cm³ to $8\times10^{17}$ at/cm³, for example, $4\times10^{17}$ at/cm³.

Although a pixel 80 comprising two assemblies of a storage area associated with two memory areas has been described, the pixel may comprise more than two assemblies of a storage area associated with at least one memory area.

Specific embodiments have been described. Various alterations, modifications, and improvements will occur to those skilled in the art. In particular, an array of TOF pixels of the type of those previously described may be controlled according to a global shutter control mode or according to a rolling shutter control mode.

Further, it may be provided for array 3 of sensor 1 to comprise a plurality of groups of pixels, each group comprising a TOF pixel and pixels capable of detecting red, green, and blue light to obtain a three-dimensional color image of a scene.

The described embodiments are not limited to the specific examples of layout and configuration of the vertical electrodes shown in FIGS. 4A to 4C, 5, 6A, 6B, and 7A to 7D. Other layouts of vertical electrodes and/or a number of electrodes per pixel different from what has been shown may be provided. Further, although embodiments of pixels where photogenerated charges corresponding to electrons are detected, stored, and transferred have been described, it will be within the abilities of those skilled in the art to form similar pixels where the charges are holes, by inverting all conductivity types and by adapting the voltage levels applied to the various elements of these pixels.

Various embodiments with different variations have been described hereabove. It will be within the abilities of those skilled in the art to combine various elements of these various embodiments and variations without showing any inventive step. For example, an intermediate region 71 arranged under the gate of a transistor $Tmem_i$ has been described. An intermediate region may also be provided under the gates of transistors $Tsn_i$, $Tmem_i'$, $Tmem_{i1}'$, $Tmem_{i2}'$, $Tsn_{i1}'$ and/or $Tsn_{i2}'$. This intermediate region will be arranged to border the N-type area or region towards which the charge transfer is performed, and will have a doping level higher than that of a layer 43 and lower than that of the area or region towards which this transfer is performed.

Figure 7B:
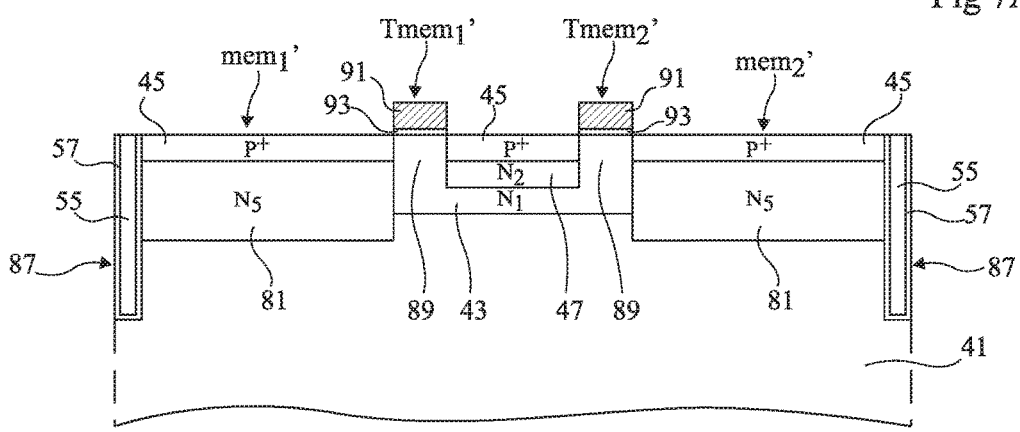
Figure 7C:
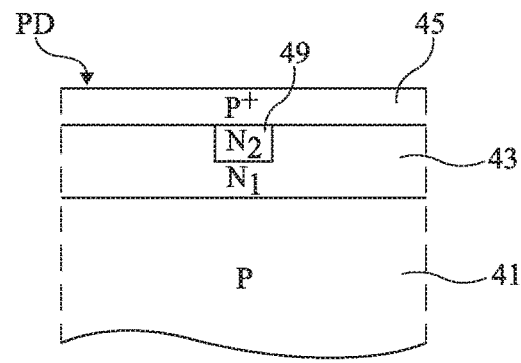
Figure 7D:
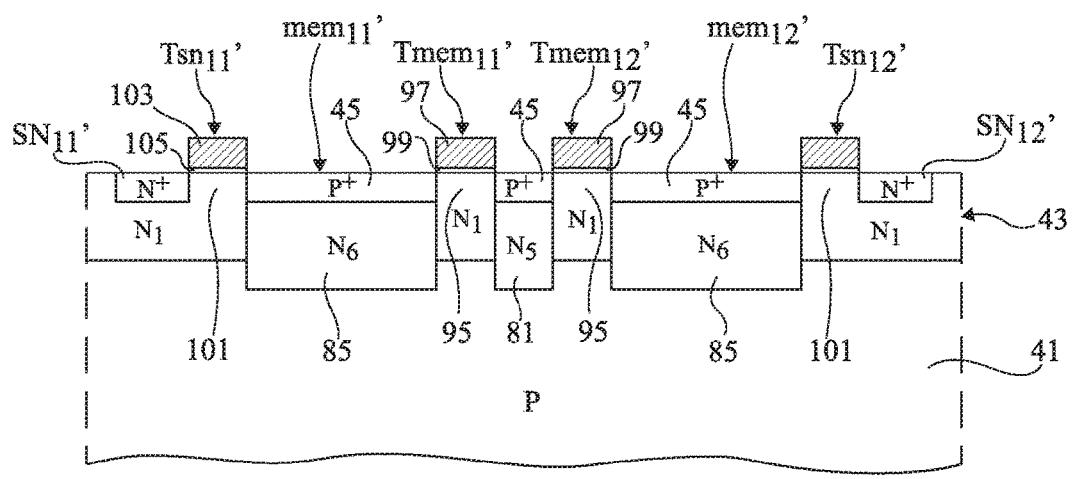

It may also be provided for a transistor for resetting photosensitive PD to be provided in a pixel of the type of that in FIGS. 7A to 7C. Further, in a pixel comprising no transistor for resetting the photosensitive element, such a resetting may be performed by controlling the pixel transistors to create a conductive path between the photosensitive element and a high potential, for example, potential Vdd.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A time-of-flight detection pixel, comprising:
    a photosensitive area comprising a first doped layer of a first conductivity type;
    a charge collection area extending in the first doped layer and being more heavily doped of the first conductivity type than the first doped layer, said charge collection area comprising a central doped portion and a plurality of doped finger portions of the first conductivity type extending radially away from the central portion; and
    at least two charge storage areas extending radially away from the central doped portion of the charge collection area and each comprising a first well more heavily doped of the first conductivity type than the charge collection area and separated from said central doped portion of the charge collection area by a first portion of the first doped layer coated with a first gate, each charge storage area being laterally delimited by two parallel insulated conductive electrodes facing each other.

2. The pixel of claim 1, further comprising a second heavily-doped layer of a second conductivity type coating the photosensitive area, the charge collection area and the first well.

3. The pixel of claim 1, wherein the first doped layer is supported by a doped semiconductor substrate of the second conductivity type.

4. The pixel of claim 1, wherein the doped finger portions are more heavily doped than the first doped layer and more lightly doped than or of a same doping level as the charge collection area.

5. The pixel of claim 1, further comprising, under each first gate, a doped intermediate area of the first conductivity type interposed between the first portion and the first well, the doped intermediate area being more heavily doped than the first portion and more lightly doped than the first well.

6. The pixel of claim 1, further comprising a region more heavily doped of the first conductivity type than the charge collection area, configured to be coupled to a reference potential, and separated from the charge collection area by a second portion of the first doped layer coated with a second gate.

7. The pixel of claim 1, further comprising, for each charge storage area, a sense area more heavily doped of the first conductivity type than the first well, the storage area extending all the way to the sense area and being separated from the sense area by a third portion of the first doped layer coated with a third gate.

8. The pixel of claim 7, wherein said third gate is configured to receive a signal having a second potential to allow or forbid a charge transfer from the charge storage area to the sense area.

9. The pixel of claim 1, further comprising a second heavily-doped layer of a second conductivity type coating the pixel except for each portion of the first doped layer coated with the first gate.

10. A time-of-flight detection pixel, comprising:
    a photosensitive area comprising a first doped layer of a first conductivity type;
    a charge collection area extending in the first doped layer and being more heavily doped of the first conductivity type than the first doped layer;
    at least two charge storage areas extending from the charge collection area and each comprising a first well more heavily doped of the first conductivity type than the charge collection area and separated from said charge collection area by a first portion of the first doped layer coated with a first gate, each charge storage area being laterally delimited by two parallel insulated conductive electrodes facing each other; and
    at least one memory area extending from each charge storage area and comprising a second well more heavily doped of the first conductivity type than the first well, coated with the second heavily-doped layer, and separated from the first well by a third portion of the first layer coated with a third gate, the memory area being laterally delimited by two further parallel insulated conductive electrodes facing each other.

11. The pixel of claim 10, comprising two charge storage areas each of which is associated with two memory areas.

12. The pixel of claim 10, further comprising, for each memory area, a sense area more heavily doped of the first conductivity type than the second well, the memory area extending all the way to the sense area and being separated from the sense area by a fourth portion of the first doped layer coated with a fourth gate.

13. The pixel of claim 12, wherein the third gate is configured to receiving a signal having a second potential to allow or forbid a charge transfer from the charge storage area to the memory area, and wherein the fourth gate is configured to receive a signal having a third potential to allow or forbid a charge transfer from the memory area to the sense area.

14. The pixel of claim 10, wherein each sense area is electrically connected to a same terminal of a read circuit.

15. The pixel of claim 10, wherein said first gate is configured to receive a signal having a first potential to allow or forbid a charge transfer from the charge collection area to the charge storage area.

16. The pixel of claim 10, further comprising a second heavily-doped layer of a second conductivity type coating the photosensitive area, the charge collection area and the first well.

17. The pixel of claim 10, wherein the first doped layer is supported by a doped semiconductor substrate of the second conductivity type.

18. The pixel of claim 10, wherein the charge collection area extends in doped fingers of the first conductivity type, coated with the second heavily-doped layer, and extending in the photosensitive area, the doped fingers being more heavily doped than the first doped layer and more lightly doped than or of a same doping level as the charge collection area.

19. The pixel of claim 10, wherein the charge collection area is arranged in a central portion of the photosensitive area.

20. The pixel of claim 10, further comprising, under each first gate, a doped intermediate area of the first conductivity type interposed between the first portion and the first well, the doped intermediate area being more heavily doped than the first portion and more lightly doped than the first well.

21. The pixel of claim 10, further comprising a region more heavily doped of the first conductivity type than the charge collection area, configured to be coupled to a reference potential, and separated from the charge collection area by a second portion of the first doped layer coated with a second gate.

22. The pixel of claim 10, further comprising a second heavily-doped layer of a second conductivity type coating the pixel except for each portion of the first doped layer coated with the first gate.

\* \* \* \* \*